United States Patent [19]

Nakano et al.

[11] Patent Number: 5,523,722
[45] Date of Patent: Jun. 4, 1996

[54] SAW OSCILLATOR WITH ANTENNA

[75] Inventors: Yoshio Nakano, Nagoya; Akihiko Niino, Ichinomiya, both of Japan

[73] Assignee: Kabushiki Kaisha Tokai Rika Denki Seisakusho, Aichi-Ken, Japan

[21] Appl. No.: 317,521

[22] Filed: Oct. 4, 1994

[30] Foreign Application Priority Data

Oct. 6, 1993 [JP] Japan .................................. 5-250782

[51] Int. Cl.$^6$ ...................................................... H03B 5/36
[52] U.S. Cl. ................. 331/107 A; 340/825.72; 455/129
[58] Field of Search .................. 331/116 R, 116 FE, 331/117 R, 117 FE, 107 A; 340/825.72; 455/129

[56] References Cited

U.S. PATENT DOCUMENTS 4,684,853  8/1987  Coash .......................................... 318/16
4,794,622  12/1988 Isaacman et al. ....................... 375/312
5,214,338  5/1993  Tanski ................................. 310/313 B

OTHER PUBLICATIONS

Siemens Components, vol. 25, No. 4, Aug., 1990, Berlin DE, pp., 142–145, Niestroj et al., "Cost-Attractive, Reliable Remote Controls Use SAW Resonators".

Primary Examiner—Siegfried H. Grimm
Attorney, Agent, or Firm—Nawrocki, Rooney & Sivertson

[57] ABSTRACT

An oscillating circuit includes a resonator for outputting a signal, an amplifier for amplifying the signal output from the resonator, and a radiator for transmitting a radio wave by resonating the signal amplified by the amplifier. The amplifier has a transistor connected to the resonator and a fixed inductor applying an alternating current load to the transistor. The transistor outputs a signal to be adjusted by the fixed inductor to finely adjust the frequency of the radio wave.

10 Claims, 3 Drawing Sheets

SAW OSCILLATOR WITH ANTENNA

BACKGROUND OF THE INVENTION

1. Field of the Invention

The present invention relates to an oscillating circuit. More particularly, the invention relates to an oscillating circuit which improves the stability characteristics of the oscillating output signal. Applications of such an oscillator includes incorporation of the oscillator in radio wave key systems used for the remote control of automobile equipment.

2. Description of the Related Art

Recently, the use of radio systems utilizing radio waves for short distance transmission of information has increased dramatically. One example of this in the field of automobile related technology is the so-called "radio wave key system". Such systems typically operate by emitting a radio wave in the ultra high frequency (UHF) band from a transmitter incorporated in the ignition key. An automobile installed receiver then receives the radio wave and enables the control of such operations as, for example, door locking, engine starting, etc., at a location remote from the automobile.

The transmitters of these types of radio wave key systems typically incorporate an oscillator 52 that uses a crystal resonator 51 as shown in FIG. 3. The oscillator 52 oscillates the radio wave of several tens of MHz. A frequency multiplier 53 multiplies the oscillating frequency of the radio wave to obtain a desired high frequency (several hundreds of MHz). The high frequency thus obtained is amplified by an amplifier 54 in order to radiate it from an antenna 55.

Since the transmitter used in a radio wave key system is designed to be incorporated in the ignition key, it is desirable to keep the size of the transmitter as small as possible. More particularly, the number of the transmitter's component parts should be minimized and the structure of circuits should be kept simple in order to minimize the costs associated with the transmitter's manufacture. One response to the need for such a transmitter has in the past been the production of oscillators that utilize a surface acoustic wave resonator (hereinafter abbreviates as SAW resonator). SAW resonators have the advantage of small size and low cost over conventional electromagnetic structure.

The one port SAW resonator shown in FIG. 5 comprises a comb-shaped electrode 20 formed by a thin metallic film on a substrate made of a piezoelectric material, and a pair of grating reflectors 21 and 22 positioned on both sides of the electrode. An external terminal 23 is connected to the comb-shaped electrode 20. The electric signals input to the comb-shaped electrode 20 through the external terminal 23 are excited by the comb-shaped electrode 20, and transformed into elastic surface waves, and propagated along the surface of the substrate. Accordingly, the elastic surface waves are reflected by the grating reflectors 21 and 22 to generate the standing waves from the elastic surface waves. The standing waves are again converted by the comb-shaped electrode 20 into electric signals. In this way, it is possible to acquire sharp resonant characteristics for the resonator.

In oscillators utilizing SAW type resonators, a simple one transistor circuit may be used to oscillate a radio wave at a frequency of more than several hundreds of MHz. One advantage of using this type of one transistor circuit, is that the frequency multiplier 53, like that shown in FIG. 3, can be eliminated. As a result, it is possible to design a low cost extremely small transmitter by use of the oscillator which incorporates a SAW type resonator.

FIG. 4 is a view showing a conventional oscillator which uses a SAW resonator. The conventional oscillator 61 comprises an resonator SAW, a high frequency NPN transistor Tr, resistors R1 to R3, a variable capacitor (trimmer) C1, a fixed capacitor C2, and an antenna ANT.

The transistor Tr is grounded through the emitter resistor R3, and is biased at its base by means of resistors R1 and R2. The antenna ANT is connected to the collector side of the transistor Tr. When the collector current of the transistor Tr flows through the antenna ANT, radio waves are radiated from the antenna. This antenna ANT is often formed on a printed circuit board as a printed pattern. The capacitor C1 feeds back the emitter potential of the transistor Tr to the base. This design allows fine adjustments to be made to the oscillating frequency by varying the capacitance the capacitor C1.

The capacitor C2 feeds back the collector potential of the transistor Tr to the emitter. The inductance of the antenna ANT serves as alternating current load, to fluctuate the collector potential of the transistor Tr, assuming that the transistor Tr forms a common emitter grounded amplifier. This fluctuation is fed back to the emitter through the capacitor C2. Consequently, in order to achieve a stable feedback operation, it is necessary to acquire optimal antenna inductance as the AC load.

Now, the oscillator 61 tends to generate harmonics (secondary harmonics) at, two times that of the fundamental wave's desired oscillating frequency. The high level of the secondary harmonic may in fact create a problem, especially given regulations of some governmental agencies. For example, Japanese Radio Law requires that when a particular transmitter generates a signal at a frequency in excess of 320 MHz, the field intensity generated thereby should undergo a rapid decrease.

For example, if the fundamental wave is set at 160 MHz or more, the secondary harmonics (320 MHz) would not be within the regulated range of the field intensity in some cases. In particular, should a fundamental wave at approximately 300 MHz be transmitted from a radio wave key system, the secondary harmonic (at approximately 600 MHz) would most likely exceed the regulated field intensity.

Also, as described above, it is necessary to acquire optimal antenna inductance for the conventional oscillator 61. Consequently, the design of the oscillator 61 should allow the oscillating frequency to be fine tuned.

Antennas of the type described above, however, are usually arranged on a printed circuit board as a printed pattern. Consequently, it is impossible to modify the inductance once the printed circuit board is completed. One solution to this is to use a plurality of printed circuit boards each containing an antenna ANT having a different inductance. The circuit boards could then be prepared before assembling the oscillator. This, unfortunately, takes a great deal of time and work. Moreover, for those antennas which are arranged in patterns on printed circuit boards the actual inductance value of the antenna ANT is restricted by the configuration and size of the printed circuit board to be used. As a result, it is oftentimes difficult to design an antenna that can serve as an AC load and that provides for the fine tuning adjustment of the oscillator's oscillating frequency.

SUMMARY OF THE INVENTION

The present invention is designed to solve the above-mentioned problems. It is an object of the invention to provide an oscillator having very stable characteristics, which produces smaller harmonics, is easy to design and whose oscillating frequency can be fine tuned.

In order to achieve the above-mentioned object, an oscillator of the present invention is arranged wherein a resonator transmits electric signals. The signals are amplified by an amplifier and supplied to a radiator. The radiator outputs radio waves by resonating the signals from the amplifier. The amplifier is provided with a transistor coupled to the resonator, and a fixed inductor which provides an alternating current load for the transistor. The frequency of radio waves can be finely adjusted by using the fixed inductor to adjust the output of the transistor.

BRIEF DESCRIPTION OF THE DRAWINGS

The features of the present invention that are believed to be novel are set forth with particularity in the appended claims. The invention, together with objects and advantages thereof, may be understood by reference to the following description of the presently preferred embodiments together with the accompanying drawings in which:

DETAILED DESCRIPTION OF THE PREFERRED EMBODIMENTS

Figure 1:
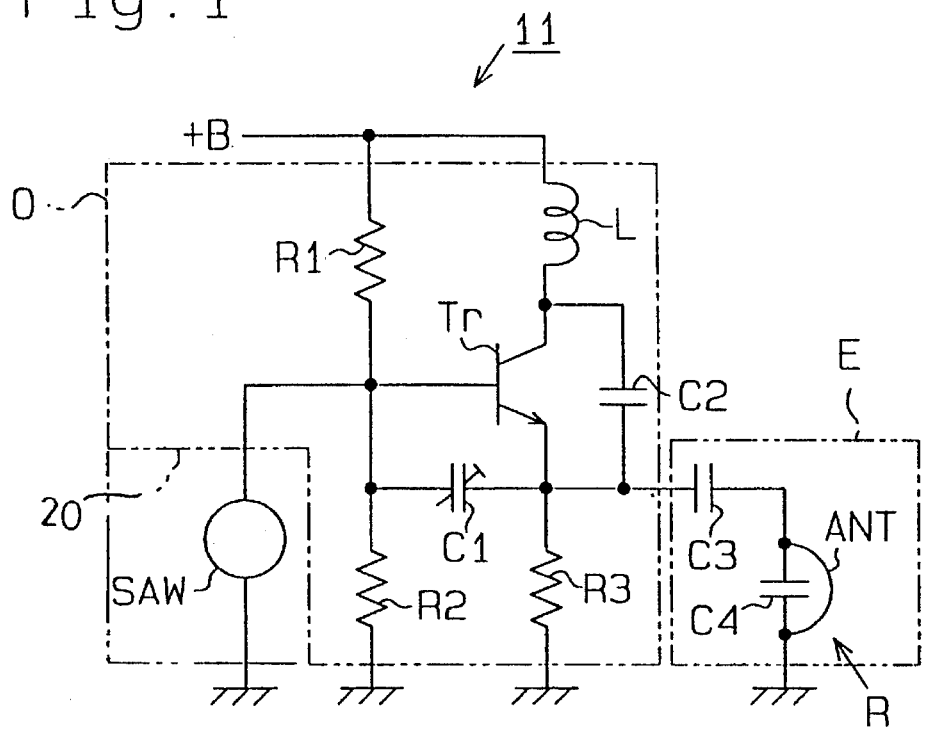
FIG. 1 is a circuit diagram showing an oscillator used for a radio wave key system for an automobile according to an embodiment of the present invention.

A radio wave key system for an automobile according to one embodiment of the present invention will now be described with reference to FIG. 1.

Figure 5:
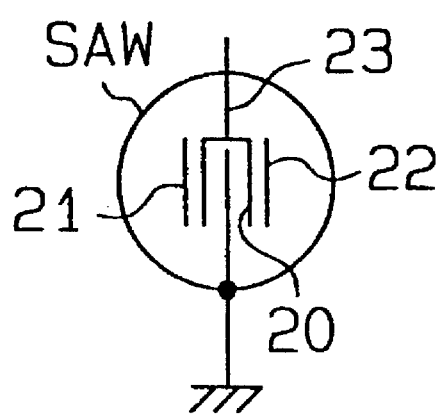
FIG. 5 is a circuit diagram showing a conventional single port SAW resonator.

An oscillator 11 of the present invention comprises a Surface-Acoustic-Wave (SAW) resonator SAW, a high frequency NPN transistor Tr, resistors R1 to R3, a variable capacitor (trimmer) C1, fixed capacitors C2 to C4, a fixed inductor L, and an antenna ANT. The resonator SAW of the present embodiment is of the same structure as the one shown in FIG. 5.

The combination of the resonator SAW, transistor Tr, resistors R1 to R3, variable capacitor C1, fixed capacitor C2, and fixed inductor L form a transmitter O. The fixed capacitors C3 and C4, and antenna ANT constitute a radiator E. All of the elements of the transmitter O, excepting the resonator SAW, form an amplifier 20. Further, the capacitor C4 and antenna ANT constitute a resonator circuit R.

The transistor Tr is grounded through the emitter resistor R3, and is biased at its base by the resistors R1 and R2. A power supply B is connected to the base of the transistor Tr through the resistor R1. The antenna ANT, formed as a pattern on a printed circuit board, is coupled to the emitter of the transistor Tr by means of the capacitor C3. The antenna ANT radiates radio waves when the emitter current of the transistor Tr flows through the antenna ANT.

The coupling of capacitor C1 to the transistor Tr provides the transistor's emitter potential as feedback to the base of the transistor Tr. Thus by varying the capacitance of the capacitor C1, it is possible to fine tune the oscillating frequency. Moreover, the capacitor C2 feeds back the collector potential of the transistor Tr to its emitter.

The oscillator 11 of the present embodiment differs from the conventional oscillator 61 in the following items (1) and (2).

The first item (1) is that instead of the antenna ANT being directly coupled to the transistor's collector, as in the conventional oscillator 61, a fixed inductor L is inserted on the collector side of the transistor Tr.

Assuming that the transistor Tr constitutes a typical grounded emitter amplifier, the fixed inductor L can be used to supply an alternating current load to the amplifier. A further distinguishing advantage of using the fixed inductor L is that it provides a series inductance to the resonator SAW. The specific use of the fixed inductor L and variable capacitor C1 as described provides improved fine tuning adjustment capability to the oscillator 11.

This advantage is enhanced by the fact that it is possible to use an inductor widely available on the market (a chip inductor, for instance) for the fixed inductor L. As a result, the inductance can be modified easily even after the completion of the printed circuit board. As compared with the conventional oscillator 61 provided with the antenna ANT formed on the printed circuit board, design freedom is enhanced according to the present invention of the oscillator 11.

In addition, the installation of the fixed inductor L as contemplated by the present invention is not restricted by the configuration or size of the printed circuit board. Consequently, it is easier to design the inductor L to function as the AC load. This enhances oscillation stability.

The second item (2) in which the present embodiment differs from conventional oscillator designs is that the oscillating output is sourced from the collector of the transistor Tr through the capacitors C2 and C3, i.e., to the resonator R. It is thereby possible to significantly reduce the secondary harmonics radiating from the antenna ANT by adjusting the resonant frequency of the resonator R to coincide with that of the fundamental wave of the oscillator 11. Contributing to this reduction is the fact that the antenna ANT is formed as a pattern on the printed circuit board. Moreover, the capacitor C3 is designed with a sufficiently small capacitance in order to minimize its influence on the oscillating output of the oscillator 11.

An additional benefit of incorporating fixed inductor L and capacitors C3, C4 is that the size of the oscillator circuit 11 need not be increased by any significant amount in order to achieve the advantages as described in items (1) and (2). Likewise, increases if any to the manufacturing costs of the present invention over that of conventional oscillators is vastly outweighed by the enhancement in the performance characteristics of the present invention. The advantage provided by conventional oscillators respecting their use of SAW type resonators, i.e., making extremely small transmitters, is enhanced by the present invention.

As described in the item (1) above, since oscillation stability is enhanced, it is possible to adjust the variable range of the oscillating frequency. Also, as described in the item (2) above, the secondary harmonics radiating from the antenna ANT can be significantly reduced. Consequently, according to the oscillator 11 of the present invention, it is possible to keep the secondary harmonics (320 MHz or more) within the range of the regulated field intensity even when the fundamental wave is set at 160 MHz or more. For example, in a transmitter of a radio wave key system, the secondary harmonics (approximately 600 MHz) can be easily suppressed to be within the range of the regulated field intensity if the oscillator 11 of the present invention is used even when the fundamental wave is set at approximately 300 MHz.

Moreover, the structure as described in the items (1) and (2) above, allows the oscillator O and the radiator E to be formed as separate components. This allows even further flexibility in the design and manufacture of the oscillator 11.

Figure 2:
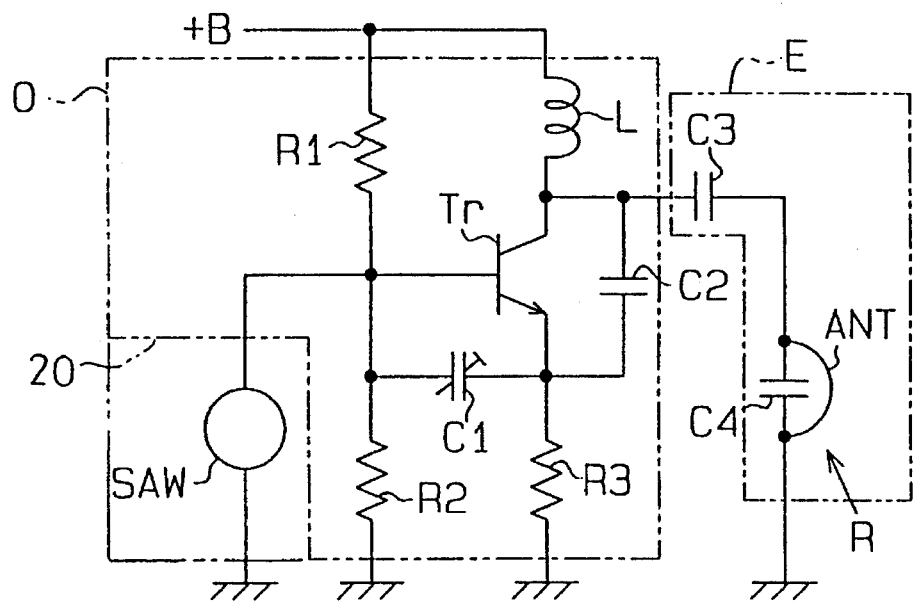
FIG. 2 is a circuit diagram showing an oscillator according to another embodiment of the present invention.
Figure 3:
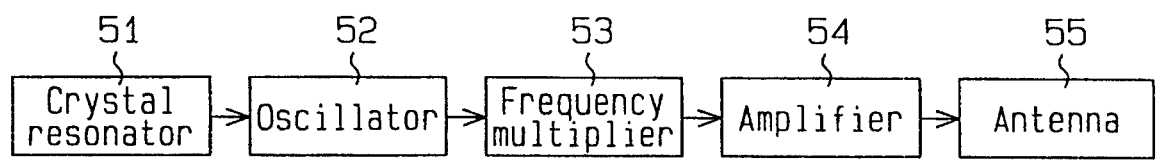
FIG. 3 is a block diagram showing a conventional transmitter having an oscillator provided with a crystal resonator.
Figure 4:
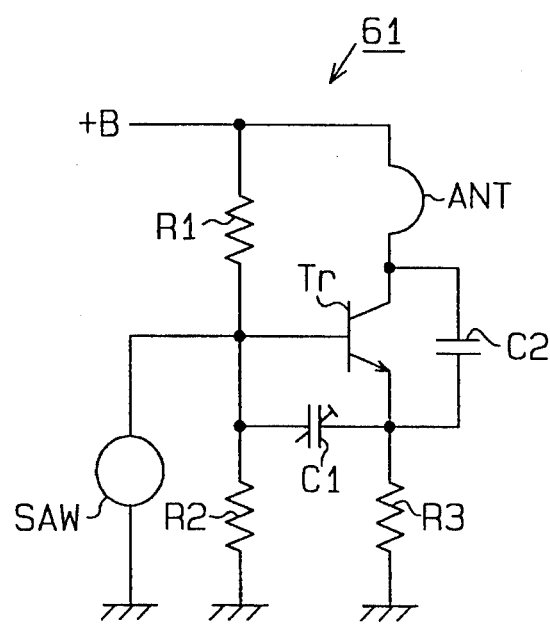
FIG. 4 is a circuit diagram showing a conventional oscillator using an SAW resonator.

It should be noted that the present invention is not limited to the above-mentioned embodiments, and it may be implemented as follows:

Rather than providing the oscillating output directly from the emitter, the output can be provided indirectly from the emitter of the transistor Tr through the capacitors C2 and C3 as in FIG. 2. To achieve the same enhancements, as described above in the first embodiment, the capacitor C3 of this embodiment should have a smaller capacitance than it has in the first embodiment. Minimizing the capacitance of C3 in this way reduces any interference produced by C3 on the oscillatory output.

Figure 6:
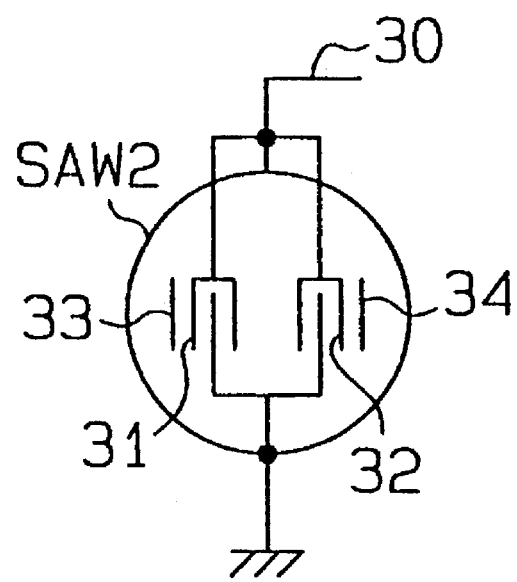
FIG. 6 is a circuit diagram showing a conventional oscillator using a double port SAW resonator.

In place of the resonator SAW, it may be possible to use a two port resonator SAW2 as shown in FIG. 6. The two port resonator SAW2 comprises a pair of comb-shaped electrodes 31 and 32 connected in parallel to the external terminal 30, and a pair of grating reflectors 33 and 34 each arranged outside the comb-shaped electrodes 31 and 32, respectively. In general, however, it is easier for the single port resonators to enhance the stability of an oscillatory signal due to the fact that resonance deterioration or loss is less than that with two port resonators. One port resonators, moreover are capable of functioning with less feedback.

The present invention may further be designed with power supplied to the fixed inductor L and the resistor R1 from different power supplies, respectively. Also, the resonator R comprising the capacitor C4 and antenna ANT may be replaced with a resonator formed independently of the antenna ANT.

Accordingly, the present examples and embodiments are to be considered as illustrative and not restrictive and the invention is not to be limited to the details given herein, but may be modified within the scope of the appended claims.

What is claimed is:

1. An oscillating circuit comprising:
   a surface acoustic wave resonator (SAW resonator) for converting an electric input signal to a corresponding standing wave output signal, wherein said SAW resonator comprises a comb-shaped electrode for converting the electric input signal to a surface wave, and a pair of reflectors disposed at both sides of the electrode to convert the surface wave to the standing wave output signal;
   an amplifier coupled to said SAW resonator for amplifying the standing wave output signal;
   a radiator coupled to said amplifier for transmitting a radio wave by resonating the amplified signal; and
   said amplifier having a transistor connected to the SAW resonator and an inductor for applying an alternating current load to the transistor, wherein the transistor outputs a signal that is adjusted by the inductor to finely tune the frequency of the radio wave.

2. An oscillating circuit according to claim 1, wherein said amplifier further includes a variable capacitor connected to the transistor, said variable capacitor finely adjusting the frequency of the surface wave in cooperation with the inductor.

3. An oscillating circuit according to claim 2 further comprising:
   said amplifier including a first resistor and a first capacitor; and
   said transistor including a base connected to the SAW resonator, an emitter grounded via the first resistor and a collector connected to the radiator via the first capacitor, wherein a potential of the emitter is fed back to the collector via the first capacitor.

4. An oscillating circuit according to claim 3, wherein said amplifier further includes second and third resistors that bias the base of the transistor.

5. An oscillating circuit according to claim 3, wherein said radiator includes:
   a second capacitor directly connected to the emitter of the transistor;
   an antenna connected in series to the second capacitor for radiating the radio wave responsive to the signal from the amplifier; and
   a third capacitor connected in parallel to the antenna, said third capacitor suppressing a high frequency wave in the radio wave radiated from the antenna.

6. An oscillating circuit according to claim 3, wherein said radiator includes:
   a second capacitor directly connected to the collector of the transistor;
   an antenna connected in series to the second capacitor for radiating the radio wave responsive to the signal from the amplifier; and
   a third capacitor connected in parallel to the antenna, said third capacitor suppressing a high frequency wave in the radio wave radiated from the antenna.

7. An oscillating circuit comprising:
   a surface acoustic wave resonator (SAW resonator) for converting an electric input signal to a corresponding standing wave output signal, wherein said SAW resonator includes a comb-shaped electrode for converting the electric input signal to the surface wave, and a pair of reflectors disposed at both sides of the electrode to convert the surface wave to the standing wave output signal;
   an amplifier coupled to said SAW resonator for amplifying the standing wave output signal;
   a radiator coupled to said amplifier for transmitting a radio wave by resonating the amplified signal, said radiator including an antenna for radiating a radio wave and a first capacitor connected in parallel to the antenna, said first capacitor suppressing a high frequency wave in the radio wave; and
   said amplifier having a transistor connected to the resonator and an inductor applying an alternating current load to the transistor, wherein the transistor outputs a signal that is adjusted by the inductor.

8. An oscillating circuit according to claim 7, wherein said radiator further includes a second capacitor for coupling the signal from the transistor to the antenna.

9. An oscillating circuit according to claim 7 further comprising:
   said amplifier including a first resistor and a second capacitor; and
   said transistor including a base connected to the SAW resonator, an emitter grounded via the first resistor and a collector connected to the radiator via the second capacitor, wherein a potential of the emitter is fed back to the collector via the second capacitor.

10. An oscillating circuit comprising:

a surface acoustic wave resonator (SAW resonator) for converting an electric input signal to a corresponding standing wave output signal, wherein said SAW resonator comprises a pair of comb-shaped electrodes for converting the electric input signal to a surface wave, and a pair of reflectors respectively associated with said pair of comb-shaped electrodes, each reflector being disposed adjacent to the associated electrodes to convert the surface wave to the standing wave output signal;

an amplifier coupled to said SAW resonator for amplifying the standing wave output signal;

a radiator coupled to said amplifier for transmitting a radio wave by resonating the amplified signal; and said amplifier having a transistor connected to the SAW resonator and an inductor for applying an alternating current load to the transistor, wherein the transistor outputs a signal that is adjusted by the inductor to finely tune the frequency of the radio wave.

* * * * *